United States Patent [19]
Sexton et al.

[11] Patent Number: 5,402,749
[45] Date of Patent: Apr. 4, 1995

[54] ULTRA-HIGH VACUUM/CHEMICAL VAPOR DEPOSITION OF EPITAXIAL SILICON-ON-SAPPHIRE

[75] Inventors: Douglas A. Sexton, Adair Village, Oreg.; Howard W. Walker, San Diego, Calif.

[73] Assignee: The United States of America as represented by the Secretary of the Navy, Washington, D.C.

[21] Appl. No.: 237,511

[22] Filed: May 3, 1994

[51] Int. Cl.$^6$ .................................. H01L 21/20
[52] U.S. Cl. .................................. 117/84; 437/84; 437/106; 437/126
[58] Field of Search .................. 437/84, 85, 83, 126, 437/101, 106; 148/DIG. 150; 117/84

[56] References Cited

U.S. PATENT DOCUMENTS

| | | | |
|---|---|---|---|
| 4,508,590 | 4/1985 | Kaplan et al. | 118/729 |
| 4,579,609 | 4/1986 | Reif et al. | 427/39 |
| 4,826,711 | 5/1989 | Yamazaki et al. | 118/719 |
| 4,874,464 | 10/1989 | Goodwin | 437/85 |
| 4,910,163 | 3/1990 | Jain | 437/85 |
| 4,940,505 | 7/1990 | Schachameyer et al. | 437/88 |
| 5,018,479 | 5/1991 | Markunas et al. | 118/723 |
| 5,037,774 | 8/1991 | Yamawaki et al. | 437/84 |
| 5,042,887 | 8/1991 | Yamada | 427/255 |

FOREIGN PATENT DOCUMENTS

0041709 3/1980 Japan .................................. 437/84

OTHER PUBLICATIONS

S. S. Lau et al., "Improvement of Crystalline Quality of Epitaxial Si Layers by Ion-Implantation Techniques," *Appl. Phys. Lett.* 34(1), 1 Jan. 1979, pp. 76–78.

B. S. Meyerson, "Low-temperature Silicon Epitaxy by Ultrahigh Vacuum/Chemical Vapor Deposition," *Appl. Phys. Lett.* 48(12) 24 Mar. 1986, pp. 797–799.

E. D. Richmond et al., "Molecular Beam Epitaxy Versus Chemical Vapor Deposition of Silicon on Sapphire," *Appl. Phys Lett.* 56(25), 18 Jun. 1990, pp. 2551–2553.

Gottilieb in J.Crystal Growth 121(1971), pp. 327–333 in "The epitaxial growth and properties of p-type silicon on spinel using a dual-rate deposition technique".

*Primary Examiner*—R. Bruce Breneman
*Assistant Examiner*—Ramamohan Rao Paladugu
*Attorney, Agent, or Firm*—Harvey Fendelman; Thomas Glenn Keough

[57] ABSTRACT

A method of fabricating epitaxial thin films, such as doped films or silicon-on-sapphire films, relies upon ultrahigh vacuum vapor deposition. The method calls for a preparing of an ultrahigh vacuum chamber to reduce water and oxygen pressure to below $10^{-10}$ Torr. At at least one sapphire substrate is placed in the ultrahigh vacuum chamber and is purged in the chamber with about 600 sccm hydrogen for about 5 minutes. A silicon film or a doped film is deposited on the sapphire substrate at temperatures between about 700 and 850° C. with base pressures between about 1.0 and 2.0μ and gas flow rates of about 2.0 sccm $SiH_4$ and 20 sccm $H_2$ for about 30 minutes to provide an about 1000 Å thick silicon film, or, doped film, on the sapphire substrate.

6 Claims, 1 Drawing Sheet

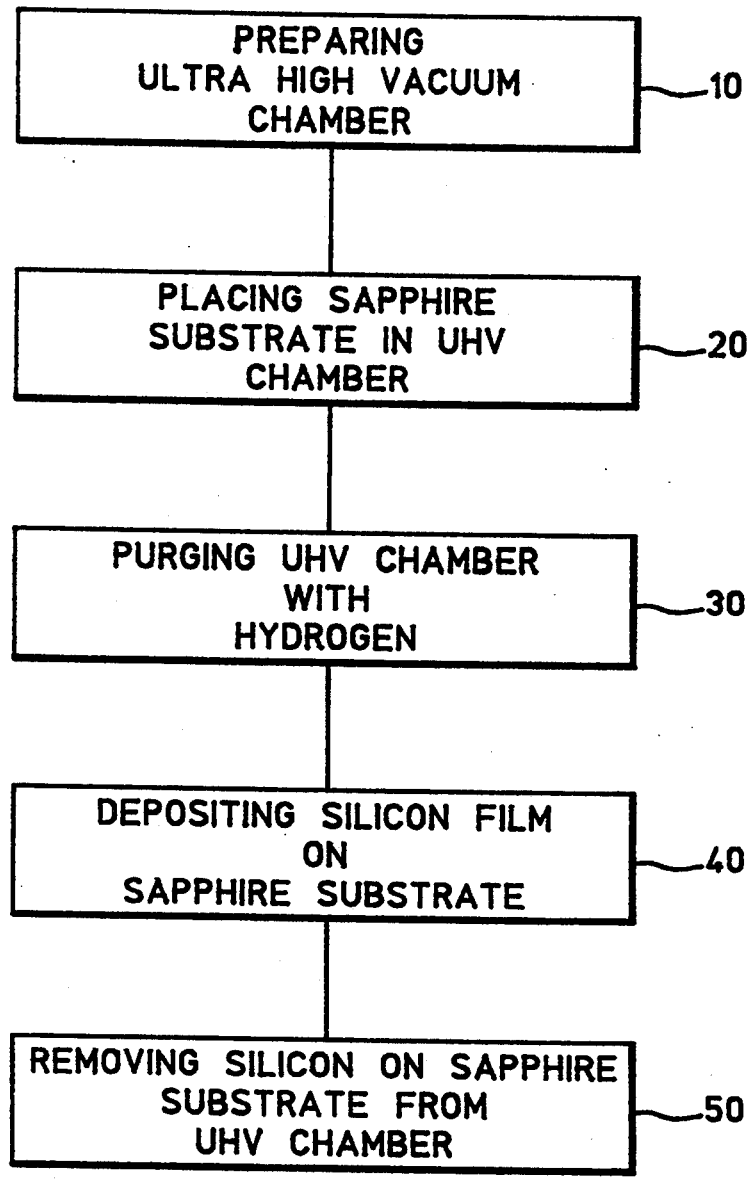

ULTRA-HIGH VACUUM/CHEMICAL VAPOR DEPOSITION OF EPITAXIAL SILICON-ON-SAPPHIRE

The invention described herein may be manufactured and used by or for the Government of the United States of America for governmental purposes without the payment of any royalties thereon or therefor

BACKGROUND OF THE INVENTION

Silicon-on-sapphire (SOS) has been used for a number of years as a substrate for the fabrication of integrated circuits. The quality of the epitaxial material, as grown, has limited its device utility to special purpose applications such as satellite electronics where its inherent radiation hardness properties are exploited, Techniques for reducing the defect densities of the silicon film have extended the applicability of the material to very advanced, fully depleted, submicron field effect transistors (FETs), These devices have a very large commercial potential.

SOS is commercially produced by atmospheric pressure chemical vapor deposition of silicon on highly polished sapphire substrates, This material is plagued with microtwin defects which cause diffusion spikes, lower mobilities, and junction shorts. The literature teaches that these microtwins can be removed by solid-phase epitaxial (SPE) regrowth of the film, see the article by S. S. Lau et al, entitled "Improvement of Crystalline Quality of Epitaxial Si Layers by Ion-Implantation Techniques," *Appl. Phys. Lett.* 34(1), 1 Jan. 1979. The technique of this article involves the amorphization of a portion of the film containing the defects by ion implantation with silicon followed by a SPE regrowth. By dramatically reducing the defect density of the silicon/sapphire interfacial region, the material can be utilized in the construction of high performance FETs with submicron gate lengths. By thinning the material down to 1000 Å or below, the FETs can be operated in a fully depleted mode, further enhancing their performance.

In accordance with this inventive concept, therefore, a need has become discovered for a method of using recently developed epitaxial growth techniques which can be applied to produce silicon-on-sapphire films in a more direct fashion to offer potentially more thickness uniformity and control with reduced defect densities.

SUMMARY OF THE INVENTION

The present invention is directed to providing a method for the application of ultra-high vacuum chemical vapor deposition techniques for the fabrication of high quality epitaxial films of silicon-on-sapphire. The method of fabricating epitaxial thin films, such as doped films or silicon-on-sapphire films relies upon ultrahigh vacuum vapor deposition. The method calls for a preparing of an ultrahigh vacuum chamber to reduce water and oxygen pressure to below $10^{-10}$ Torr. Next, a placing of at least one substrate, e.g. a sapphire substrate, in the ultrahigh vacuum chamber precedes a purging of the chamber containing the sapphire substrate with about 600 sccm hydrogen for about 5 minutes. A depositing of a thin film, e.g. a silicon film or a doped film, on the sapphire substrate at temperatures between 700° and 850° C. proceeds with base pressures between about 1.0 and 2.0 $\mu$ and gas flow rates of about 2.0 sccm $SiH_4$ and 20 sccm $H_2$ for about 30 minutes to provide an about 1000 Å thick silicon film, or, doped film, on the sapphire substrate which allows a subsequent removing of the silicon-on-sapphire substrate from the ultrahigh vacuum chamber.

An object of the invention is to provide an improvement over atmospheric CVD processes for the fabrication of high quality thin films.

Another object is to provide an improved method over atmospheric CVD processes which provides high quality thin films that is more cost effective.

Another object of the invention is to provide an improvement over atmospheric CVD processes for the fabrication of high quality doped films.

Another object is to provide an improved method over atmospheric CVD processes which provides high quality doped films that is more cost effective.

Another object of the invention is to provide an improvement over atmospheric CVD processes for the fabrication of high quality silicon-on-sapphire films.

Another object is to provide an improved method over atmospheric CVD processes which provides high quality silicon-on-sapphire films that is more cost effective.

Another object of the invention is to provide an improved method of fabricating high quality thin films that are thinner, more defect-free and more uniform than heretofore produced.

Another object is to provide a method of providing high quality films having an improved crystal quality at a reduced cost per unit.

Another object is to provide a method for providing improved deposition of doped material.

Yet another object is to provide a method in which substrates can be heated by a variety of heating means.

Another object is to provide improved deposition techniques of thin films in ultra-high vacuum chemical vapor depositions.

These and other objects of the invention will become more readily apparent from the ensuing specification and claims when taken in conjunction with the appended drawings.

BRIEF DESCRIPTION OF THE DRAWING

The figure shows a block diagram representation of the method of the invention.

DESCRIPTION OF THE PREFERRED EMBODIMENT

The salient features of the ultra-high vacuum chemical vapor deposition technique for the fabrication of high quality epitaxial films of silicon-on-sapphire are appreciated in the context of a conventional SOS growth method. Molecular beam epitaxy (MBE) growth of SOS produces high quality films which are essentially free of microtwin defects, see the article by Eliezer Dovid Richmond et al. in their article entitled "Molecular Beam Epitaxy Versus Chemical Vapor Deposition of Silicon-on-Sapphire," *Appl. Phys. Lett.*, 56 (25), 18 Jun. 1990 MBE, however, has been found to be a slow and expensive process which is not suitable for large scale commercialization.

Ultra-high vacuum chemical vapor deposition, however, is a technique which has recently been applied to silicon homoepitaxy, note the article by B. S. Meyerson entitled "Low-Temperature Silicon Epitaxy by Ultra-High Vacuum/Chemical Vapor Deposition," *Appl. Phys. Lett.*, 48 (12), 24 Mar. 1986. Because of the low levels of impurities in the high vacuum environment, epitaxial growth can occur at lower temperatures than in an atmospheric CVD reactor. Growth rates are low because of the temperatures; however, throughput can be maintained since many wafers can be processed simultaneously.

As a general rule, low growth rates and low impurity levels lead to good crystalline quality. The low defect films produced by low temperature MBE imply that films grown by UHVCVD are superior to those grown using the presently utilized technique of atmospheric CVD and that such films do not require the solid-phase epitaxial regrowth of the film treatment, see the S. S. Lau article above. The UHVCVD approach allows films of 1000 Å or less to be grown with high uniformity and without the necessity of undergoing thinning procedures.

An example of the method which may be used to grow silicon epitaxial films on sapphire in an UHVCVD reactor may follow parts of the procedure of the above identified article by Meyerson. After suitable preparation of the reactor chamber to reduce water and oxygen vapor pressures to below $10^{-10}$ Torr, the clean dehydrated samples of sapphire substrate elements are introduced into the UHV portion of the reactor chamber. The UHV chamber then is purged with about 600 sccm hydrogen for about 5 minutes. The silicon film then is deposited at temperatures between about 700° and about 850° C., with base pressure at between about 1.0 and about 2.0$\mu$, and gas flow rates of approximately 2.0 sccm SiH$_4$ and 20 sccm H$_2$. Deposition time should be approximately 30 minutes for 1000 Å thick films.

The method of fabricating epitaxial silicon films on sapphire using ultra-high vacuum vapor deposition is depicted in the figure. First, there is a preparing 10 of an ultra-high vacuum chamber to reduce water and oxygen pressures to below $10^{-10}$ Torr. A placing 20 of at least one sapphire substrate in the ultra-high vacuum chamber precedes a purging 30 of the sapphire substrate in the chamber with hydrogen. The purging can be at about 600 sccm hydrogen for about 5 minutes. A depositing 40 of a silicon film on the sapphire substrate is effected in the ultra-high vacuum chamber at temperatures between about 700° and about 850° C. with base pressures between about 1 and about 2$\mu$ and gas flow rates of about 2 sccm SiH$_4$ and about 20 sccm S$_2$ for about 30 minutes to provide an about 1000 Å thick silicon film on the sapphire substrate. The removing of the thin film silicon-on-sapphire from the ultra-high vacuum chamber provides an improved defect-free silicon-on-sapphire substrate which avoids several other costly and time-consuming processing steps that heretofore have been necessary in the fabrication of silicon-on-sapphire substrates.

The substrate in the UHVCVD system may be heated in a number of different fashions, including heater coils as in a furnace, RF inductor coils, heat lamps, etc. The vacuum, optionally, can be higher if the substrate is cleaned directly prior to film deposition by rapid heating and cooling in a reduced environment such as hydrogen, plasma cleaning, ion bombardment in situ or in an instrument cluster system.

The obvious advantages of the above disclosed ultrahigh vacuum vapor deposition of silicon-on-sapphire over atmospheric CVD processes is that high quality films are made at reduced cost. The as-deposited films are thinner, more defect free and more uniformly than presently produced. The benefits of UHVCVD over MBE are less per wafer cost and, perhaps, improved crystal quality. Present-day MBE systems also have difficulty depositing doped materials, a product not suffered by UHVCVD. In that regard, the substrates may be fabricated from different materials and the deposited thin films need not be only silicon but may be any of a variety of semiconductor materials that may very well have dopants incorporated if desired, for example, boron or the like.

Having the teachings of the invention disclosed herein, one skilled in the art to which this invention pertains will find it to be within the purview of ordinary skill to suitably and appropriately fit the processing parameters for the UHVCVD process to accommodate a desired substrate and a desired thin film semiconductor material, as well as the desired dopants incorporated in the thin film material.

Obviously, many modifications and variations of the present invention are possible in the light of the above teachings. It is therefore to be understood that within the scope of the appended claims, the invention may be practiced otherwise than as specifically described.

We claim:

1. A method of fabricating heteroepitaxial silicon-on-sapphire using ultrahigh vacuum chemical vapor deposition comprising:
   preparing an ultrahigh vacuum chamber to reduce water and oxygen pressure to below $10^{-10}$ Torr;
   placing a sapphire substrate in said ultrahigh vacuum chamber;
   purging said sapphire substrate with hydrogen;
   depositing a silicon film on said sapphire substrate at temperatures between about 700° and about 850° C. with base pressures between 1.0 and 2.0$\mu$ and gas flow rates of about 2.0 sccm SiH$_4$ and 20 sccm H$_2$ for about 30 minutes to provide an about 1000 Å thick silicon film on said silicon-on-sapphire substrate; and
   removing said sapphire substrate having said about 1000 Å thick silicon film thereon from said ultrahigh vacuum chamber.

2. A method according to claim 1 in which said purging is with about 600 sccm hydrogen for about 5 minutes.

3. A method of fabricating a heteroepitaxial thin film on a substrate using ultrahigh vacuum chemical vapor deposition comprising:
   preparing an ultrahigh vacuum chamber to reduce water and oxygen pressure to below $10^{-10}$ Torr;
   placing a said substrate in said ultrahigh vacuum chamber;
   purging said substrate with hydrogen;
   depositing said thin film on said substrate at temperatures between about 700° and about 850° C. with base pressures between 1.0 and 2.0$\mu$ and gas flow rates of about 2.0 sccm SiH$_4$ and 20 sccm H$_2$ for about 30 minutes to provide an about 1000 Å said thin film on said substrate; and
   removing said substrate having said about 1000 Å thin film thereon from said ultrahigh vacuum chamber.

4. A method according to claim 3 in which said purging is with about 600 sccm hydrogen for about 5 minutes.

5. A method of fabricating a heteroepitaxial epitaxial thin film including dopants on a substrate using ultrahigh vacuum chemical vapor deposition comprising:
   preparing an ultrahigh vacuum chamber to reduce water and oxygen pressure to below $10^{-10}$ Torr;

placing a said substrate in said ultrahigh vacuum chamber;

purging said substrate with hydrogen;

depositing said thin film having including on said substrate at temperatures between about 700° and about 850° C. with base pressures between 1.0 and 2.0μ and gas flow rates of about 2.0 sccm SiH$_4$ and 20 sccm H$_2$ for about 30 minutes to provide an about 1000 Å said thin film including dopants on said substrate; and removing said substrate having said about 1000 Å thin film including dopants thereon from said ultrahigh vacuum chamber.

6. A method according to claim 5 in which said purging is with about 600 sccm hydrogen for about 5 minutes.

* * * * *